(12) United States Patent
Kim

(10) Patent No.: US 9,257,196 B2
(45) Date of Patent: Feb. 9, 2016

(54) SEMICONDUCTOR DEVICES INCLUDING E-FUSE ARRAYS

(71) Applicant: SK hynix Inc., Icheon-si Gyeonggi-do (KR)

(72) Inventor: Youn Cheul Kim, Saratoga, CA (US)

(73) Assignee: SK Hynix Inc., Gyeonggi-do (KR)

( * ) Notice: Subject to any disclaimer, the term of this patent is extended or adjusted under 35 U.S.C. 154(b) by 241 days.

(21) Appl. No.: 14/174,140

(22) Filed: Feb. 6, 2014

(65) Prior Publication Data

US 2015/0221392 A1    Aug. 6, 2015

(51) Int. Cl.
*G06F 9/00* (2006.01)
*G11C 17/16* (2006.01)
*G11C 17/18* (2006.01)

(52) U.S. Cl.
CPC .............. *G11C 17/16* (2013.01); *G11C 17/18* (2013.01)

(58) Field of Classification Search
CPC ...... H03K 17/22; H01L 23/525; H01L 27/06; G11C 17/16; G11C 17/18
USPC ........................................................ 713/1, 2
See application file for complete search history.

(56) References Cited

U.S. PATENT DOCUMENTS

| 8,836,386 | B1 * | 9/2014 | Hwang | G06F 1/24 327/142 |
|---|---|---|---|---|
| 2008/0310196 | A1 | 12/2008 | Lin | |
| 2010/0038748 | A1 * | 2/2010 | Yamaguchi | G11C 17/16 257/529 |
| 2011/0291744 | A1 * | 12/2011 | Kim | G11C 17/18 327/525 |
| 2013/0285709 | A1 * | 10/2013 | Oh | G11C 29/027 327/109 |
| 2014/0056084 | A1 * | 2/2014 | Jeong | G11C 17/16 365/189.09 |

FOREIGN PATENT DOCUMENTS

KR    100854419 B1    8/2008

* cited by examiner

*Primary Examiner* — Vincent Tran
(74) *Attorney, Agent, or Firm* — William Park & Associates Ltd.

(57) ABSTRACT

Semiconductor systems are provided. The semiconductor system includes a boot-up operation circuit and a timing sensor. The boot-up operation circuit transmits control data stored in a fuse array portion to a first data latch unit and a second data latch unit. The timing sensor detects timings of internal control signals to generate a restart signal. The boot-up operation circuit re-transmits the control data to the first and second data latch units.

25 Claims, 5 Drawing Sheets

SEMICONDUCTOR DEVICES INCLUDING E-FUSE ARRAYS

BACKGROUND

1. Technical Field

Embodiments of the present disclosure generally relate to semiconductor devices, and more specifically to e-fuse arrays as they relate to semiconductor packages within semiconductor devices.

2. Description of Related Art

Semiconductor devices may include fuses that store information necessary for various internal control operations, for example, setup information, repair information or the like. General fuses can be programmed in a wafer level because a logic level of each data is determined according to an electrical open/short state of each fuse. However, once the semiconductor devices are encapsulated to form semiconductor packages, it may be impossible to program the general fuses in the semiconductor packages. E-fuses are widely used to solve the aforementioned disadvantage. Each of the e-fuses may be realized using a transistor, for example, a nonvolatile memory (NVM) cell transistor having a floating gate or a charge trapping layer. In such a case, a data may be stored in the e-fuse by programming or erasing the transistor to change a threshold voltage of the transistor. That is, the e-fuse may be electrically open or short according to a resistance value between a source and a drain of the transistor employed as the e-fuse.

In order to correctly recognize the data stored in the e-fuses, a size of the transistors employed as the e-fuses has to be increased or amplifiers have to be used without increasing the size of the transistors employed as the e-fuses. However, in any case, there may be limitations in increasing the integration density of the semiconductor devices including the e-fuses.

Recently, e-fuse arrays have been proposed to solve the limitations of the integration density of the e-fuses and to store the information necessary for various internal control operations of the semiconductor devices. In the event that the e-fuse arrays are employed in the semiconductor devices, the e-fuse arrays may share the amplifiers with each other. Accordingly, the integration density of the semiconductor devices may be improved.

SUMMARY

Various embodiments are directed to semiconductor devices.

According to various embodiments, a semiconductor device includes a boot-up operation circuit and a timing sensor. The boot-up operation circuit transmits control data stored in a fuse array portion to a first data latch unit and a second data latch unit in response to a plurality of internal control signals internally generated. The timing sensor detects timings of the internal control signals to generate a restart signal. The boot-up operation circuit re-transmits the control data to the first and second data latch units in response to the restart signal.

According to various embodiments, a semiconductor device includes a period signal generator suitable for generating a boot-up period signal; a boot-up operation circuit suitable for transmitting control data stored in a fuse array portion to a first data latch unit and a second data latch unit in response to a plurality of internal control signals internally generated; and a timing sensor suitable for detecting timings of internal control signals to generate a restart signal.

In an embodiment, a system includes a processor; a controller suitable for receiving a request and a data from the processor; and a memory unit suitable for receiving a controlled request and the data from the controller, wherein the controller is configured includes a boot-up operation circuit suitable for transmitting control data stored in a fuse array position to a first data latch unit and a second data latch unit in response to a plurality of internal control signals internally generated; and a timing sensor suitable for detecting timings of internal control signals to generate a restart signal, wherein the boot-up operation circuit re-transmits the control data to the first and second data latch units in response to the restart signal.

BRIEF DESCRIPTION OF THE DRAWINGS

Embodiments of the invention will become more apparent in view of the attached drawings and accompanying detailed description, in which.

DETAILED DESCRIPTION OF THE EMBODIMENTS

Embodiments of the invention will be described hereinafter with reference to the accompanying drawings. However, the embodiments described herein are for illustrative purposes only and are not intended to limit the scope of the invention.

Figure 1:
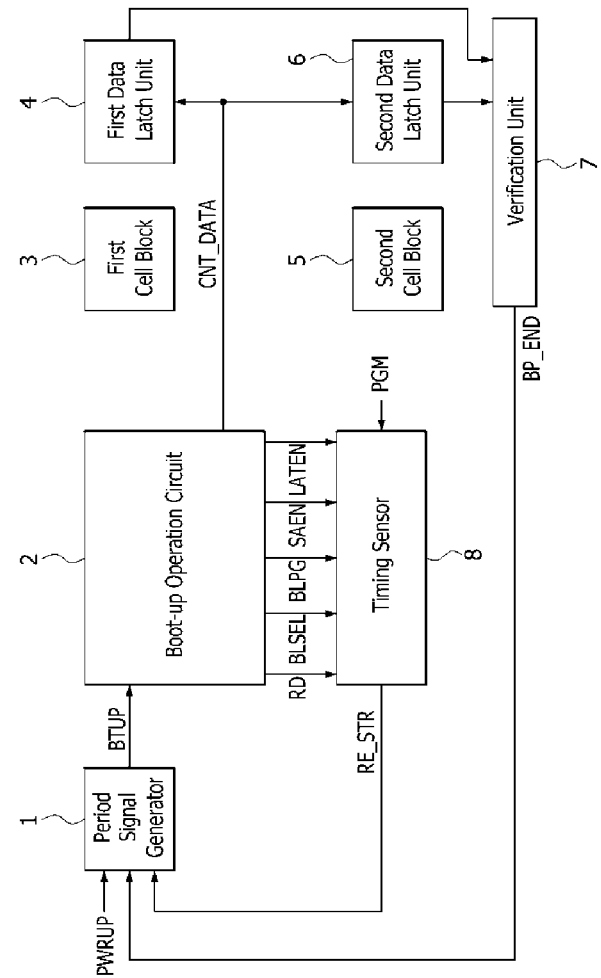
FIG. 1 is a block diagram illustrating a semiconductor device according to an embodiment of the invention.

Referring to FIG. 1, a semiconductor device according to an embodiment of the present invention may include a period signal generator 1, a boot-up operation circuit 2, a first cell block 3, a first data latch unit 4, a second cell block 5, a second data latch unit 6, a verification unit 7 and a timing sensor 8.

The period signal generator 1 may generate a boot-up period signal BTUP in response to a power-up signal PWRUP, a boot-up end signal BP_END and a restart signal RE_STR. The boot-up period signal BTUP may be enabled when a level of the power-up signal PWRUP is changed or the restart signal RE_STR is enabled. Accordingly, the boot-up period signal BTUP may be enabled when a power voltage signal applied to the semiconductor device reaches a predetermined level to change a voltage level of the power-up signal PWRUP. A level of the power-up signal PWRUP may be changed from a logic "low" level to a logic "high" level or vice versa when a level of a power voltage signal reaches a predetermined level after the power voltage signal is applied to the semiconductor device. A logic level of the restart signal RE_STR while the restart signal RE_STR is enabled may be different according to the embodiments. The boot-up period signal BTUP may be disabled when the boot-up end signal BP_END is enabled. The boot-up period signal BTUP may be disabled when control data CNT_DATA are normally transmitted to the first data latch unit 4 and second data latch unit 6. A logic level of the boot-up end signal BP_END while the boot-up end signal BP_END is enabled may be different according to the embodiments.

The boot-up operation circuit 2 may execute a boot-up operation in response to a plurality of internal control signals such as a read signal RD, a data line selection signal BLSEL, a pre-charge signal BLPG, a sense amplifier enablement signal SAEN; and a latch enablement signal LATEN which are internally generated to have predetermined timings during an enablement period of the boot-up period signal BTUP. The boot-up operation circuit 2 may receive the boot-up period signal BTUP enabled during the enablement period or predetermined period to generate a plurality of internal control signals. The boot-up operation may correspond to an operation that control data CNT_DATA generated from the boot-up operation circuit 2 are transmitted to the first data latch unit 4 and the second data latch unit 6. The control data CNT_DATA may be stored in a fuse array portion 221 (see FIG. 3) included in the boot-up operation circuit 2. The boot-up operation circuit 2 may be suitable for transmitting control data stored in the e-fuse array portion 221 to the first data latch unit 4 and the second data latch unit 6 in response to a plurality of internal control signals which are internally generated to have predetermined timings during a predetermined period where the boot-up period signal BTUP is enabled. The control data CNT_DATA may include information for controlling internal operations of the first cell block 3 and information for controlling internal operations of the second cell block 5. The information for controlling the internal operations of the first and second cell blocks 3 and 5 may be repair information or set-up information used in repair operations that replace failed cells in the first and second cell blocks 3 and 5 with redundancy cells. The information for controlling the internal operations of the first cell block 3 may be transmitted to the first data latch unit 4 to be latched; and the information for controlling the internal operations of the second cell block 5 may be transmitted to the second data latch unit 6 to be latched.

The verification unit 7 may generate the boot-up end signal BP_END enabled when the boot-up operation is normally executed. That is, the verification unit 7 may generate the boot-up end signal BP_END enabled when the control data are normally transmitted to the first latch unit 4 and second latch unit 6; when the information for controlling the internal operations of the first cell block 3 is transmitted to the first data latch unit 4 to be latched; and the information for controlling the internal operations of the second cell block 5 is transmitted to the second data latch unit 6 to be latched.

The timing sensor 8 may detect generation timings of the internal control signals including the read signal RD, the data line selection signal BLSEL, the pre-charge signal BLPG, the sense amplifier enablement signal SAEN and the latch enablement signal LATEN to generate the restart signal RE_STR. The timing sensor 8 may generate the restart signal RE_STR enabled when the generation timings of the internal control signals are mismatched. A programming signal PGM may be a signal for programming the control data CNT_DATA and may be unnecessary for the boot-up operation. Thus, the timing sensor 8 may generate the restart signal RE_STR enabled when the programming signal PGM is generated. The generation timings of the read signal RD, the data line selection signal BLSEL, the pre-charge signal BLPG, the sense amplifier enablement signal SAEN and the latch enablement signal LATEN will be described in detail with reference to FIGS. 3 and 6 later. The restart signal RE_STR may be enabled to control the boot-up operation circuit 2 such that the boot-up operation circuit re-transmits the control data CNT_DATA to the first and second data latch units 4 and 6 respectively.

Figure 2:
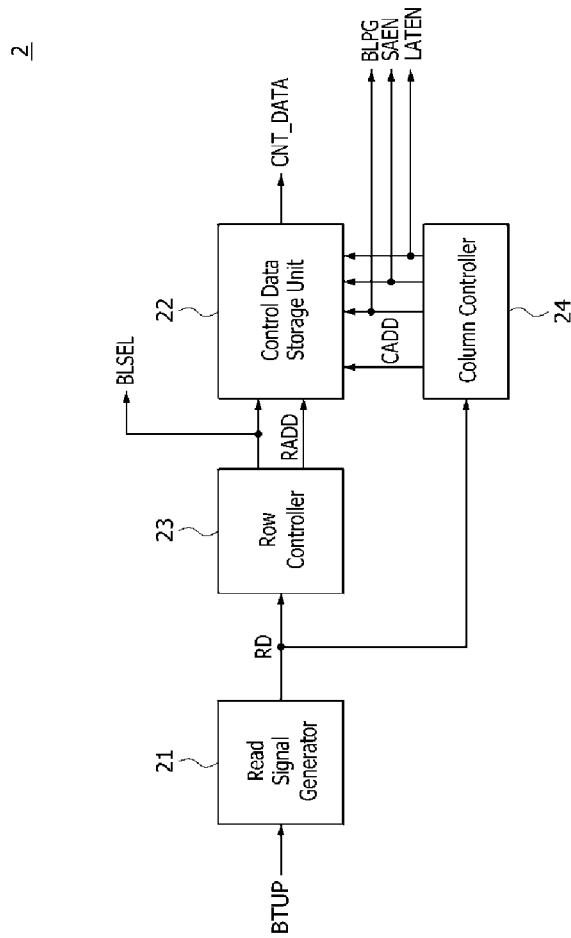
FIG. 2 is a block diagram illustrating a boot-up operation circuit included in the semiconductor device of FIG. 1.

Referring to FIG. 2, the boot-up operation circuit 2 may include a read signal generator 21, a control data storage unit 22, a row controller 23 and a column controller 24. The read signal generator 21 may be suitable for generating the read signal RD in response to a boot-up period signal BTUP enabled during the predetermined period. The read signal generator 21 may generate a read signal RD, which is enabled to output the control data CNT_DATA stored in the control data storage unit 22, while the boot-up period signal BTUP is enabled. The row controller 23 may generate the data line selection signal BLSEL and a row address signal RADD in synchronization with the read signal RD and may apply the data line selection signal BLSEL and the row address signal RADD to the control data storage unit 22. The column controller 24 may generate a column address signal CADD, the pre-charge signal BLPG, the sense amplifier enablement signal SAEN and the latch enablement signal LATEN in synchronization with the read signal RD and may apply the column address signal CADD, the pre-charge signal BLPG, the sense amplifier enablement signal SAEN and the latch enablement signal LATEN to the control data storage unit 22.

Figure 3:
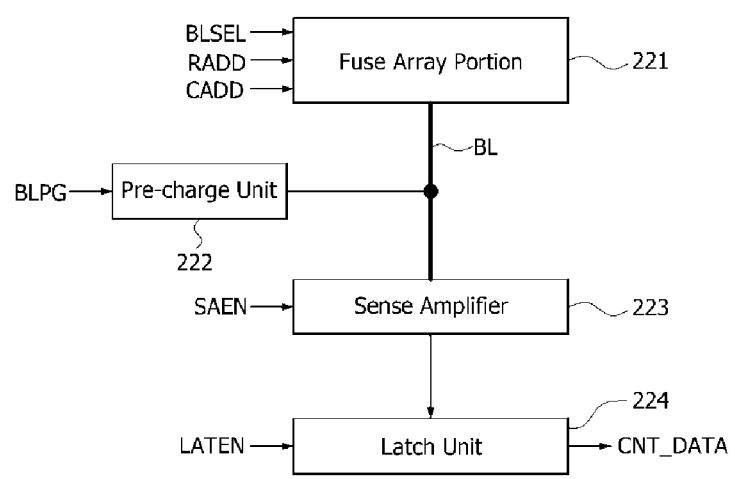
FIG. 3 is a block diagram illustrating a control data storage unit included in the boot-up operation circuit of FIG. 2.
Figure 4:
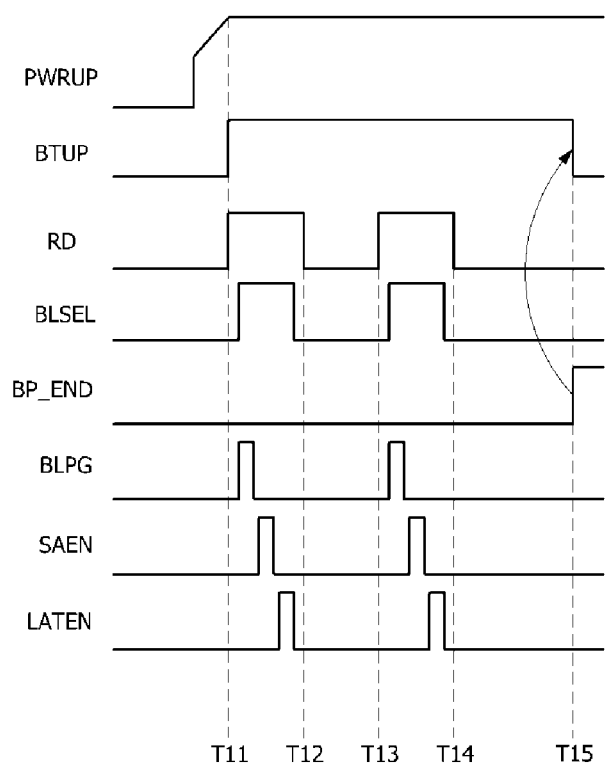
FIG. 4 is a timing diagram illustrating an operation of the control data storage unit shown in FIG. 3.

Referring to FIG. 3, the control data storage unit 22 may include a fuse array portion 221, a pre-charge unit 222, a sense amplifier 223 and a latch unit 224. The fuse array portion 221 may be realized by arraying a plurality of e-fuses to store the control data CNT_DATA including information for controlling the internal operations of the first cell block 3 and the second cell block 5. The fuse array portion 221 may output the control data CNT_DATA stored in the e-fuses which are accessed by the row address signal RADD and the column address signal CADD through a data line BL while the data line selection signal BLSEL is enabled. When a pulse of the pre-charge signal BLPG is generated, the pre-charge unit 222 may be suitable for receiving the precharge signal BLPG and may pre-charge the data line BL through which the control data CNT_DATA are outputted. The data line BL through which the control data CNT_DATA is outputted from the fuse array portion 221 may be pre-charged whenever the first pulse and second pulse of the pre-charge signal BLPG are generated. When a pulse of the sense amplifier enablement signal SAEN is generated, the sense amplifier 223 may be suitable for receiving the sense amplifier enablement signal SAEN and may sense and amplify levels of the control data CNT_DATA outputted through the data line BL from the fuse array portion 221. When a pulse of the latch enablement signal LATEN is generated, the latch unit 224 may be suitable for receiving the latch enablement signal LATEN and may latch and output the control data CNT_DATA amplified by the sense amplifier 223. The amplified control data may be latched and outputted to the first data latch unit 4 and the second data latch unit 6 whenever the first and second pulses of the latch enablement signal LATEN are generated. An operation of the control data storage unit 22 illustrated in FIG. 3 will be described hereinafter with reference to FIG. 4.

At a point of time "T11" that a level of the power voltage signal reaches a predetermined level after the power voltage signal is applied to the semiconductor device to change a level of the power-up signal PWRUP from a logic "low" level to a logic "high" level, the boot-up period signal BTUP may be enabled to have a logic "high" level.

If the boot-up period signal BTUP is enabled, the read signal RD may be enabled to have a logic "high" level for a first period between the point of time "T11" and a point of time "T12" to transmit the control data CNT_DATA including the information for controlling the internal operations of the first cell block 3 to the first data latch unit 4 and may be enabled to have a logic "high" level for a second period between a point of time "T13" and a point of time "T14" to transmit the control data CNT_DATA including the information for controlling the internal operations of the second cell block 5 to the second data latch unit 6. The read signal RD may be enabled in the first period and a second period may be included in a period that the boot-up period signal BTUP is enabled. The first period may be suitable for transmitting the control data CNT_DATA to the first data latch unit 4 and the second period may be suitable for transmitting the control data CNT_DATA to the second data latch unit 6.

The data line selection signal BLSEL may be generated to be enabled in the first and second periods T11~T12 and T13~T14 according to the read signal RD and may be used to access the e-fuses in which the control data CNT_DATA are stored. The restart signal RE_STR may be enabled when the data line selection signal BLSEL is disabled in at least one period of the first period and the second period. Further, each of the pre-charge signal BLPG, the sense amplifier enablement signal SAEN and the latch enablement signal LATEN may include a first pulse and a second pulse. The first pulse of the pre-charge signal BLPG, the first pulse of the sense amplifier enablement signal SAEN and the first pulse of the latch enablement signal LATEN may be sequentially generated in the first period T11~T12, and the second pulse of the pre-charge signal BLPG, the second pulse of the sense amplifier enablement signal SAEN and the second pulse of the latch enablement signal LATEN may be sequentially generated in the second period T13~T14. The restart signal RE_STR may be enabled when the first pulses of the pre-charge signal BLPG, the sense amplifier enablement signal SAEN, and the latch enablement signal LATEN are not sequentially generated in the first period. The restart signal RE_STR may also be enabled when the second pulses of the pre-charge signal BLPG, the sense amplifier enablement signal SAEN, and the latch enablement signal LATEN are not sequentially generated in the second period.

The boot-up operation may normally terminate when the control data CNT_DATA including the information for controlling the internal operations of the first cell block 3 are transmitted to the first data latch unit 4 to be latched and the control data CNT_DATA including the information for controlling the internal operations of the second cell block 5 are transmitted to the second data latch unit 4 to be latched. At a point of time "T15" that the normal termination of the boot-up operation is verified, the boot-up end signal BP_END may be enabled to have a logic "high" level and the boot-up period signal BTUP may be disabled to have a logic "low" level.

The semiconductor device having the aforementioned configuration may execute the boot-up operation to transmit the control data CNT_DATA including the information for controlling the internal operations of the first cell block 3 to the first data latch unit 4; and to transmit the control data CNT_DATA including the information for controlling the internal operations of the second cell block 5 to the second data latch unit 6. If a process/voltage/temperature (PVT) condition varies, the generation timings of the internal control signals including the read signal RD, the data line selection signal BLSEL, the pre-charge signal BLPG, the sense amplifier enablement signal SAEN and the latch enablement signal LATEN may be mismatched to cause an abnormal boot-up operation. For example, when the data line selection signal BLSEL is not enabled in the periods that the read signal RD is enabled or the pulses of the pre-charge signal BLPG, the sense amplifier enablement signal SAEN and the latch enablement signal LATEN are not sequentially generated in the periods that the read signal RD is enabled, the control data CNT_DATA may be abnormally transmitted to the first and second data latch units 4 and 6 to cause malfunction of the semiconductor device. Thus, the semiconductor device according to embodiments may generate the restart signal RE_STR enabled when the generation timings of the internal control signals are mismatched, thereby re-enabling the boot-up period signal BTUP to execute the boot-up operation again. As a result, the control data CNT_DATA may be normally transmitted to the first and second data latch units 4 and 6. In addition, even when the programming signal PGM is unnecessarily generated during the boot-up operation, the semiconductor device according to the embodiments may re-execute the boot-up operation to prevent malfunctions from occurring.

Figure 5:
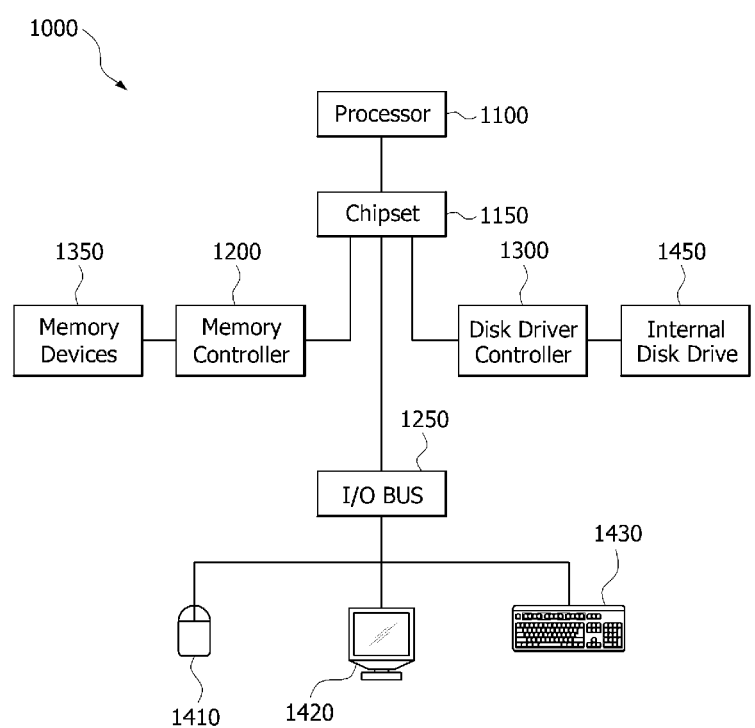
FIG. 5 illustrates a block diagram of a system employing a memory controller circuit in accordance with an embodiment of the invention.

Referring to FIG. 5, a block diagram of a system 1000 employing a memory controller 1200 in accordance with an embodiment of the invention. The system 1000 may include one or processors or central processing units ("CPUs") 1100. The CPU 1100 may be used individually or in combination with other CPUs.

A chipset 1150 may be operably coupled to the CPU 1100. The chipset 1150 may be a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150.

The memory controller 1200 may be operable coupled to the chipset 1150 and may include the semiconductor device described above. The memory controller 1200 may include at least one memory controller which delays the generation of the address signal, and blocks consecutive accesses, of which the number exceeds the predetermined critical value, to the same word line or the same bit line of a selected memory bank of the memory unit. Thus, the memory controller 1200 can receive a request provided from the CPU 1100, through the chipset 1150. The memory controller 1200 may also be integrated into the chipset 1150 and/or operably coupled to one or more memory devices 1350. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420, and 1430 may include a mouse 1410, video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be operable coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

What is claimed is:

1. A semiconductor device comprising:
   a boot-up operation circuit suitable for transmitting control data stored in a fuse array portion to a first data latch unit and a second data latch unit in response to a plurality of internal control signals internally generated; and
   a timing sensor suitable for detecting timings of the internal control signals to generate a restart signal,
   wherein the boot-up operation circuit re-transmits the control data to the first and second data latch units in response to the restart signal.

2. The semiconductor device of claim 1, wherein the boot-up operation circuit receives a boot-up period signal enabled during a predetermined period to generate a plurality of the internal control signals.

3. The semiconductor device of claim 2,
   wherein the boot-up period signal is enabled in response to a power-up signal; and
   wherein the boot-up period signal is disabled when the control data are normally transmitted to the first and second data latch units.

4. The semiconductor device of claim 1, wherein a plurality of the internal control signals includes a read signal, a data line selection signal, a pre-charge signal, a sense amplifier enablement signal and a latch enablement signal.

5. The semiconductor device of claim 4,
   wherein the read signal is enabled in a first period and a second period included in a period that the boot-up period signal is enabled; and
   wherein the first period is set to transmit the control data to the first data latch unit and the second period is set to transmit the control data to the second data latch unit.

6. The semiconductor device of claim 5, wherein the data line selection signal is enabled in the first and second periods.

7. The semiconductor device of claim 6, wherein the restart signal is enabled when the data line selection signal is disabled in at least one period of the first period and the second period.

8. The semiconductor device of claim 5,
   wherein each of the pre-charge signal, the sense amplifier enablement signal and the latch enablement signal include a first pulse and a second pulse;
   wherein the first pulses of the pre-charge signal, the sense amplifier enablement signal and the latch enablement signal are sequentially generated in the first period; and
   wherein the second pulses of the pre-charge signal, the sense amplifier enablement signal and the latch enablement signal are sequentially generated in the second period.

9. The semiconductor device of claim 8,
   wherein a data line through which the control data are outputted from the fuse array portion is pre-charged whenever the first and second pulses of the pre-charge signal are generated;
   wherein the control data outputted through the data line are sensed and amplified whenever the first and second pulses of the sense amplifier enablement signal are generated; and
   wherein the amplified control data are latched and outputted to the first and second data latch units whenever the first and second pulses of the latch enablement signal are generated.

10. The semiconductor device of claim 9, wherein the restart signal is enabled when the first pulses of the pre-charge signal, the sense amplifier enablement signal and the latch enablement signal are not sequentially generated in the first period or when the second pulses of the pre-charge signal, the sense amplifier enablement signal and the latch enablement signal are not sequentially generated in the second period.

11. The semiconductor device of claim 4, wherein the boot-up operation circuit includes:
   a read signal generator suitable for generating the read signal in response to a boot-up period signal enabled during the predetermined period;
   a row controller suitable for generating the data line selection signal and a row address signal in response to the read signal;
   a column controller suitable for generating a column address signal, the pre-charge signal, the sense amplifier enablement signal and the latch enablement signal in response to the read signal; and
   a control data storage unit suitable for receiving the data line selection signal, the row address signal and the column address signal to output the control data stored in the fuse array portion through a data line.

12. The semiconductor device of claim 11, wherein the control data storage unit includes:
   a pre-charge unit suitable for receiving the pre-charge signal to pre-charge the data line through which the control data are outputted;
   a sense amplifier suitable for receiving the sense amplifier enablement signal to sense and amplify levels of the control data outputted from the fuse array portion through the data line; and
   a latch unit suitable for receiving the latch enablement signal to latch and output the control data amplified by the sense amplifier.

13. A semiconductor device comprising:
   a period signal generator suitable for generating a boot-up period signal;
   a boot-up operation circuit suitable for transmitting control data stored in a fuse array portion to a first data latch unit and a second data latch unit in response to a plurality of internal control signals internally generated; and
   a timing sensor suitable for detecting timings of internal control signals to generate a restart signal in response to the timings of internal control signals.

14. The semiconductor device of claim 13, wherein the boot-up period signal is enabled when a power voltage applied to the semiconductor device reaches a predetermined level to change a level of a power-up signal.

15. The semiconductor device of claim 14, further comprising a verification unit suitable for generating a boot-up end signal enabled when the control data are normally transmitted to the first and second data latch units.

16. The semiconductor device of claim 15, wherein the boot-up period signal is disabled when the boot-up end signal is enabled.

17. The semiconductor device of claim 13, wherein the boot-up period signal is enabled when the restart signal is enabled.

18. The semiconductor device of claim 17, wherein a plurality of the internal control signals includes a read signal, a data line selection signal, a pre-charge signal, a sense amplifier enablement signal and a latch enablement signal.

19. The semiconductor device of claim 18,
   wherein the read signal is enabled in a first period and a second period included in a period that the boot-up period signal is enabled; and
   wherein the first period is set to transmit the control data to the first data latch unit and the second period is set to transmit the control data to the second data latch unit.

20. The semiconductor device of claim 19, wherein the data line selection signal is enabled in the first and second periods.

21. The semiconductor device of claim 20, wherein the restart signal is enabled when the data line selection signal is disabled in at least one period of the first period and the second period.

22. The semiconductor device of claim 19,
wherein each of the pre-charge signal, the sense amplifier enablement signal and the latch enablement signal include a first pulse and a second pulse;
wherein the first pulses of the pre-charge signal, the sense amplifier enablement signal and the latch enablement signal are sequentially generated in the first period; and
wherein the second pulses of the pre-charge signal, the sense amplifier enablement signal and the latch enablement signal are sequentially generated in the second period.

23. The semiconductor device of claim 22,
wherein a data line through which the control data are outputted from the fuse array portion is pre-charged whenever the first and second pulses of the pre-charge signal are generated;
wherein the control data outputted through the data line are sensed and amplified whenever the first and second pulses of the sense amplifier enablement signal are generated; and
wherein the amplified control data are latched and outputted to the first and second data latch units whenever the first and second pulses of the latch enablement signal are generated.

24. The semiconductor device of claim 23, wherein the restart signal is enabled when the first pulses of the pre-charge signal, the sense amplifier enablement signal and the latch enablement signal are not sequentially generated in the first period or when the second pulses of the pre-charge signal, the sense amplifier enablement signal and the latch enablement signal are not sequentially generated in the second period.

25. The semiconductor device of claim 13, wherein the restart signal is enabled when generation times of the internal control signals are unmatched.

* * * * *